United States Patent
Beall et al.

(10) Patent No.: US 9,791,900 B1
(45) Date of Patent: Oct. 17, 2017

(54) EXPANSION CARD MOUNTING ASSEMBLY

(71) Applicant: Amazon Technologies, Inc., Seattle, WA (US)

(72) Inventors: Christopher Strickland Beall, Woodinville, WA (US); Felipe Enrique Ortega Gutierrez, Tacoma, WA (US); Brandyn David Giroux, Seattle, WA (US); Darin Lee Frink, Lake Tapps, WA (US); Jason Alexander Harland, Seattle, WA (US); Roey Rivnay, Seattle, WA (US); Max Jesse Wishman, Seattle, WA (US); Yangtzu Lee Andrew Lee, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 15/083,197

(22) Filed: Mar. 28, 2016

(51) Int. Cl.
*G06F 1/16* (2006.01)
*H05K 7/02* (2006.01)
*G06F 1/18* (2006.01)
*H05K 7/14* (2006.01)

(52) U.S. Cl.
CPC ........... *G06F 1/185* (2013.01); *H05K 7/1417* (2013.01)

(58) Field of Classification Search
CPC .............................. G06F 1/185; H05K 7/1417
USPC ... 361/679.32, 737, 807, 810, 801, 731, 756
See application file for complete search history.

(56) References Cited

U.S. PATENT DOCUMENTS

| | | | | | |
|---|---|---|---|---|---|
| 4,979,075 | A * | 12/1990 | Murphy | .................. | G06F 1/184 29/830 |
| 5,909,359 | A * | 6/1999 | Summers | ................ | G06F 1/184 174/250 |
| 6,246,588 | B1 * | 6/2001 | Kim | ....................... | H05K 1/141 361/786 |
| 6,731,515 | B2 * | 5/2004 | Rhoads | ................ | H05K 7/1444 361/785 |
| 7,298,625 | B1 * | 11/2007 | Wu | ......................... | G06F 1/185 174/261 |
| 8,866,023 | B2 * | 10/2014 | Kadri | ..................... | G11C 5/066 174/261 |
| 9,172,165 | B1 * | 10/2015 | Sass | ..................... | H01R 12/721 |

(Continued)

OTHER PUBLICATIONS

"DX5-ANT: XMC Mezzanine Module—SATA 6G Controller & Triple mSATA Sockets", EKF Industrial Computers and Information Technologly, Retrieved from URL: http://www.ekf.de/d/dide/dx5/dx5.html#PI on Mar. 14, 2016, pp. 1-5.

(Continued)

*Primary Examiner* — Nidhi Thaker
(74) *Attorney, Agent, or Firm* — Robert C. Kowert; Meyertons, Hood, Kivlin, Kowert & Goetzel, P.C.

(57) ABSTRACT

An expansion card mounting assembly includes a mounting structure and a circuit board coupled to the mounting structure. Expansion cards are mounted on a top side and a bottom side of the circuit board and secured at opposite ends by a moveable plate of the expansion card mounting assembly. The mounting structure includes an opening along a length of the expansion cards that allows air to flow over the expansion cards in multiple directions including a vertical direction. The moveable plate and mounting structure are configured to allow a position of the moveable plate on the mounting structure to be adjusted to mount expansion cards having different lengths in the expansion card mounting assembly.

21 Claims, 6 Drawing Sheets

(56) References Cited

U.S. PATENT DOCUMENTS

| | | | | |
|---|---|---|---|---|
| 2005/0013125 A1* | 1/2005 | Dobbs | ................... | G06F 1/184 |
| | | | | 361/801 |
| 2007/0236903 A1* | 10/2007 | Hall | ....................... | G06F 1/185 |
| | | | | 361/796 |
| 2012/0281373 A1* | 11/2012 | Bohannon | ............ | H05K 7/1489 |
| | | | | 361/756 |
| 2015/0181746 A1* | 6/2015 | Mullen | ................... | G06F 1/183 |
| | | | | 361/679.31 |

OTHER PUBLICATIONS

Wikipedia, "M.2", Retrieved from URL: https://en.wikipedia.org/wiki/M.2 on Mar. 12, 2016, pp. 1-5.

* cited by examiner

EXPANSION CARD MOUNTING ASSEMBLY

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

In many rack-mounted servers, circuit boards for the servers are housed in a rack-mounted chassis. Typically, the chassis houses a motherboard assembly, additional circuit boards, such as memory modules, coupled to the motherboard assembly, and a power supply for the electrical component in the chassis. The chassis may also house hard disk drives, fans, or other components.

Some computers, such as rack-mounted servers, may include expansion cards, such as memory cards, processor cards, graphic cards, or other types of expansion cards that are connected to the computer to expand capabilities of the computer. Different expansion cards may have different dimensions, such as different lengths, and may require holders that are designed to accommodate an expansion card with a particular set of dimensions, such as a particular length. Also, some expansion cards may share a common connector type with expansion cards having different sets of dimensions, for example expansion cards having different lengths may share a common connector type such that any of the expansion cards with different lengths can be mounted in a particular connector. However, a particular expansion card holder that is designed to accommodate an expansion card with a particular set of dimensions, such as a particular length, may not be able to accommodate an expansion card with another set of dimensions, such as a longer length.

Expansion cards mounted in a chassis of a computer, such as a rack-mounted server, may generate waste heat in addition to waste heat generated by other components of the computer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an expansion card mounting assembly, are disclosed.

According to one embodiment, an expansion card mounting assembly includes a mounting structure and a printed circuit board (PCB) coupled to the mounting structure. The PCB includes multiple expansion card connectors mounted on a first side of the PCB and additional expansion card connectors mounted on a second side of the PCB. The expansion card mounting assembly also includes expansion cards, such as peripheral component interconnect (PCI) M.2 standard cards, mounted in the expansion card connectors on the first side of the PCB and additional expansion cards, such as additional PCI M.2 standard cards, mounted in the expansion card connectors on the second side of the PCB. The expansion card mounting assembly includes multiple levels, wherein the multiple levels include the expansion cards mounted on the first side of the PCB at a first level of the expansion card mounting assembly and include the expansion cards mounted on the second side of the PCB at a second level of the expansion card mounting assembly. The mounting structure of the expansion card mounting assembly is configured to support the PCB and support the expansion cards at the first level of the expansion card mounting assembly and support the expansion cards at the second level of the expansion card mounting assembly. The mounting structure also includes an opening between the first level and the second level of the expansion card mounting assembly along a length of the expansion cards mounted in the expansion card mounting assembly. The opening is configured to permit airflow between the expansion cards mounted on the first side of the PCB and the expansion cards mounted on the second side of the PCB. For example, air may flow across expansion cards mounted in an expansion card mounting assembly in an x-direction, a y-direction, and in a z-direction via an opening between levels of the expansion card mounting assembly. In some embodiments, an expansion card mounting assembly includes a moveable plate that is configured along with the mounting structure of the expansion card mounting assembly to secure expansion cards having different dimensions. For example, a mounting structure and a moveable plate of an expansion card mounting assembly may be configured to secure different PCI M.2 standard cards having different lengths.

According to one embodiment, a device includes a mounting structure, wherein the mounting structure is configured to couple with a circuit board and support the circuit board and multiple expansion cards mounted on a first side of the circuit board and multiple expansion cards mounted on a second side of the circuit board. The mounting structure also includes an opening configured to permit airflow between multiple expansion cards mounted on a first side of a circuit board coupled to the mounting structure and multiple expansion cards mounted on a second side of the circuit board coupled to the mounting structure.

According to one embodiment, a device includes a mounting structure configured to couple with a circuit board and configured to support the circuit board and multiple expansion cards coupled to the circuit board at ends of the expansion cards. The device also includes a moveable plate coupled to the mounting structure, wherein the moveable plate and the mounting structure are configured to adjust a location of the moveable plate on the mounting structure to secure other ends of the multiple expansion cards.

As used herein, "expansion card" means a card that can be coupled with a circuit board assembly of a computer system to add functions or enhance the capability of the computer system. For example, an expansion card may be a solid state drive, a graphics card, a system on a chip, or other type of card that conforms to a form factor standard for expansion cards, such as peripheral component interconnect form factor standard M.2. In some embodiments, an expansion card may have a form factor in accordance with another standard, or may have a form factor specially designed for an application (i.e. a non-standard form factor).

As used herein, "expansion card connector" means a slot or socket in a computer system that can accept an expansion card.

As used herein, "circuit board" includes a board or card that carries one or more circuits or portions thereof. A circuit board may include, for example, a printed circuit board (PCB) made of epoxy-glass and metal layers.

As used herein, "chassis" means a structure or element that supports another element or to which other elements can be mounted. A chassis may have any shape or construction, including a frame, a sheet, a plate, a box, a channel, or a combination thereof.

As used herein, a "rack" means a rack, container, frame, or other element or combination of elements that can contain or physically support one or more computer systems.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

In some embodiments, an expansion card mounting assembly includes multiple expansion cards mounted on a first side of a circuit board and multiple expansion cards mounted on a second side of the circuit board. The circuit board, may be supported by a mounting structure that supports the expansion cards mounted on the circuit board and the circuit board at an elevated position above a chassis or motherboard on which the expansion card mounting assembly is mounted. At an end of the mounting structure of the expansion card mounting assembly that is opposite of an end of the mounting structure where a circuit board is mounted, a moveable plate may be coupled to the mounting structure. The moveable plate may include retaining mechanisms for securing expansion cards that are mounted at a first end in expansion card connectors mounted on the circuit board and that are secured at second ends by the retaining mechanisms of the moveable plate. The expansion card mounting assembly may include an opening along a length of expansion cards mounted in the expansion card mounting assembly to allow air to pass vertically between levels of expansion cards mounted in the expansion card mounting assembly to promote heat transfer from the expansion cards. In addition the opening may allow air to pass across the expansion cards in a direction in line with the length of the expansion cards and in a direction perpendicular to the length of the expansion cards, or any combination of directions in line with and perpendicular to the expansion cards. The moveable plate of the expansion card mounting assembly and the mounting structure may be configured such that the moveable plate can be coupled to the mounting structure at various positions along the mounting structure to allow for expansion cards having different lengths to be mounted in the expansion card mounting assembly.

In some embodiments, expansion cards mounted in an expansion card mounting assembly may have a form factor that complies with form factors described in the peripheral component interconnect M.2 standard. For example, the M.2 standard describes expansion cards having common widths and common connector types, but having various lengths. In some embodiments, expansion cards of various form factors, such as varying lengths in accordance with one or more other standards may be mounted in an expansion card mounting assembly.

Figure 1A:
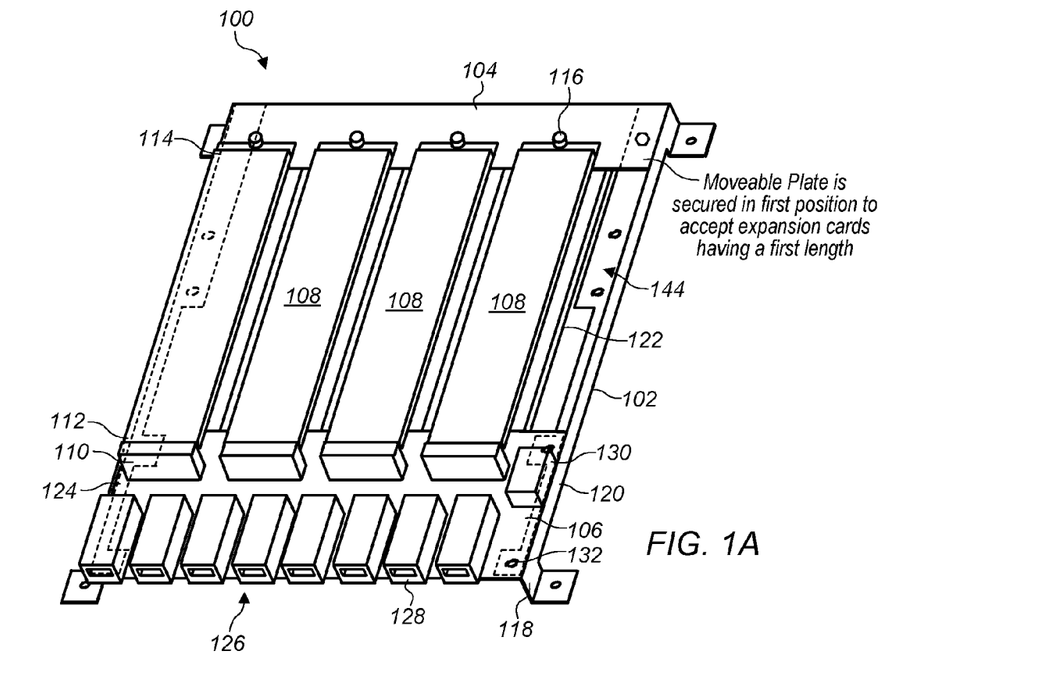
FIG. 1A illustrates a perspective view of an expansion card mounting assembly, according to some embodiments.

FIG. 1A illustrates a perspective view of an expansion card mounting assembly, according to some embodiments. Expansion card mounting assembly 100 includes mounting structure 102, moveable plate 104 coupled to mounting structure 102, printed circuit board 106 coupled to mounting structure 104, and expansion cards 108 secured in expansion card mounting assembly 100 at first ends 112 via expansion card connectors 110 mounted on printed circuit board 106 and secured at second ends 114 via retaining mechanisms 116 of moveable plate 104. Mounting structure 102 includes legs 118 that elevate body 120 of mounting structure 102 above a surface on which mounting structure 102 is mounted. The elevated body of mounting structure 102 provides space for expansion cards, such as expansion cards 108, to be mounted on a first side of a circuit board, such as a top side 124 of printed circuit board 106, and to be mounted on a second side of a circuit board, such as a bottom side 126 of printed circuit board 106. For example, expansion cards 122 are located on a lower level of expansion card mounting assembly 100 and are coupled to a bottom side 126 of printed circuit board 106. Also, expansion cards 108 are located on an upper level of expansion card mounting assembly 100 and are coupled to a top side 124 of printed circuit board 106.

A circuit board coupled to a mounting structure of an expansion card mounting assembly, such as printed circuit board 106 coupled to mounting structure 102, may include cable connectors, such as cable connectors 128, that are coupled to expansion card connectors, such as expansion card connectors 110, via a circuit trace of a circuit board on which the cable connectors and expansion card connectors are mounted. For example, printed circuit board 106 may include electrical traces connecting cable connectors 128 and expansion card connectors 110. In some embodiments, cable connectors and expansion card connectors may be coupled via cables or other suitable means. In addition, in some embodiments, a circuit board, such as printed circuit board 106, may include a power supply and power traces that distribute electrical power to components mounted on the circuit board. For example, printed circuit board 106 includes power supply 130. In some embodiments, cable connectors, such as cable connectors 128, may be coupled to expansion card connectors on a top side and on a bottom side of a circuit board. A circuit board may be coupled to a mounting structure, such as mounting structure 102, via one or more fasteners. For example, FIG. 1A illustrates holes 132 in mounting structure 102 that may permit a circuit board, such as printed circuit board 106, to be coupled to a mounting structure, such as mounting structure 102, via one or more fasteners, such as screws, rivets, etc. In some embodiments, cable connectors, such as cable connectors 128, may be blind mate connectors that are configured to couple with corresponding connectors in a computer system chassis when an expansion card mounting assembly is inserted into the computer system chassis. In some embodiments, other types of connectors may be used for cable connectors, such as cable connectors 128.

In some embodiments, an expansion card mounting assembly, such as expansion card mounting assembly 100, may be configured to secure expansion cards having different lengths. In some embodiments, an expansion card mounting assembly may be configured to secure a first group of expansion cards having a common length and later be adjusted to secure another group of expansion cards having another length. In some embodiments, an expansion card mounting assembly may be configured to secure a group of expansion cards having different lengths at the same time.

Figure 1B:
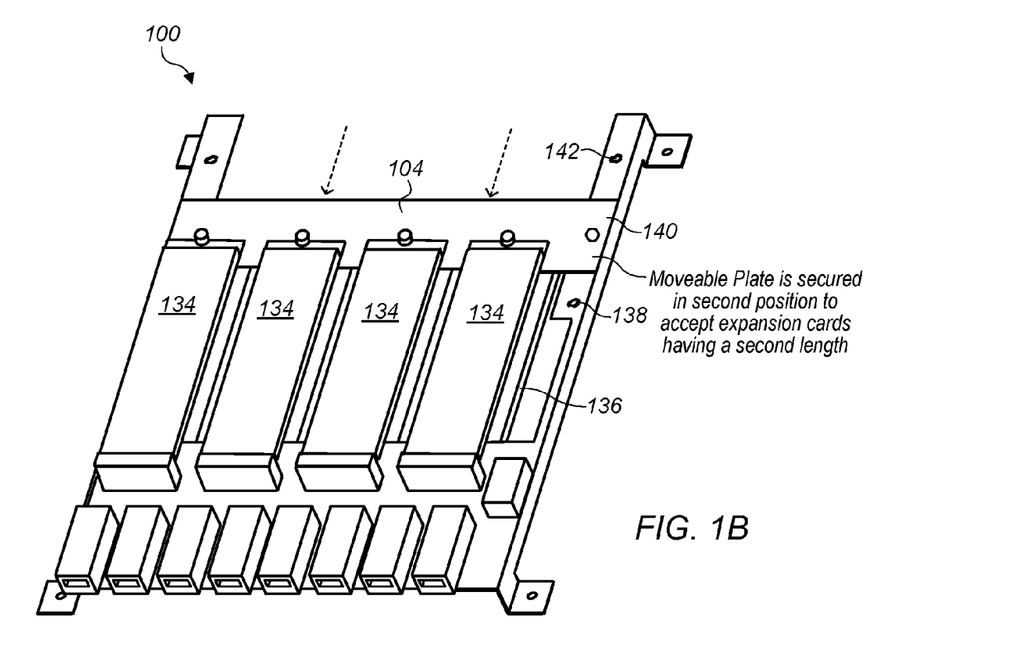
FIG. 1B illustrates a perspective view of an expansion card mounting assembly after adjusting a moveable plate of the expansion card mounting assembly, according to some embodiments.

For example, FIG. 1A illustrates an expansion card mounting assembly 100 configured to mount expansion cards 108 and 122 that have a longer length than expansion cards 134 and 136 illustrated in FIG. 1B. In FIG. 1B, the same expansion card mounting assembly 100, has been adjusted to now mount expansion cards 134 and 136 that are shorter than expansion cards 108 and 122 illustrated in FIG. 1A. In order to adjust an expansion card mounting assembly to mount expansion cards having different lengths, the expansion card mounting assembly may include a moveable plate and several mounting elements for mounting the moveable plate in different positions along a mounting structure of an expansion card mounting assembly. For example, mounting structure 102 includes holes 138, 140, and 142 at different positions along mounting structure 102. Moveable plate 104 may be secured in different positions along mounting structure 102 via holes 138, 140, and 142. For example, in FIG. 1A, moveable plate 104 is coupled with mounting structure 102 via holes 142 to accept expansion cards 108 and 122 that have a longer length than expansion cards 134 and 136. Whereas, in FIG. 1B, moveable plate 104 has been moved to a different position along mounting structure 102 and is coupled to mounting structure 102 via holes 140. This allows expansion card mounting assembly 100 that was previously configured to mount longer expansion cards 108 and 122 to be quickly and easily be re-configured to accept shorter expansion cards 134 and 136. In order to reconfigure an expansion card mounting assembly, such as expansion card mounting assembly 100, a fastener such as a screw or bolt may be removed from a current hole in which the fastener is engaged. The moveable plate of the expansion card mounting assembly may be moved to another position on the mounting structure of the expansion card mounting assembly, and the fasteners may be engaged in a new hole or other mechanism configured to receive the fasteners to couple the moveable plate in the adjusted position on the mounting structure.

In some embodiments, an expansion card mounting assembly, such as expansion card mounting assembly 100 includes an open space between a circuit board coupled to a mounting structure of the expansion card mounting assembly, such as printed circuit board 106 coupled to mounting structure 102, and a moveable plate coupled to the mounting structure at an opposite end of the mounting structure, such as opening 144 between printed circuit board 106 and moveable plate 104.

An opening between levels of an expansion card mounting assembly may increase airflow across expansion cards in an expansion card mounting assembly as opposed to expansion cards that are mounted on a motherboard that restricts airflow across the expansion card in a vertical or z-direction.

In some embodiments, a mounting structure, such as mounting structure 102 may be made of sheet metal or plastic. In some embodiments, a moveable plate, such as moveable plate 104, may be made out of sheet metal or plastic. In some embodiments other materials may be used for a mounting structure and/or moveable plate.

Figure 2A:
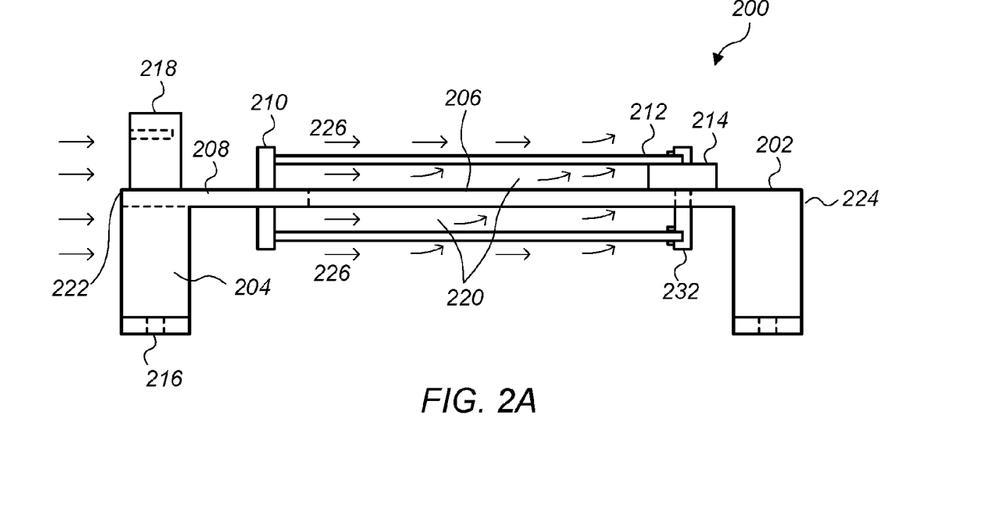
FIG. 2A illustrates a side view of an expansion card mounting assembly, according to some embodiments.

FIG. 2A illustrates a side view of an expansion card mounting assembly, according to some embodiments. Expansion card mounting assembly 200 illustrated in FIG.

2A may be the same expansion card mounting assembly 100 illustrated in FIGS. 1A and 1B. Mounting structure 202 of expansion card mounting assembly 200 includes legs 204 that elevate body 206 of expansion card mounting assembly 200 above a surface on which it is mounted. A body of an expansion card mounting assembly may include multiple levels of expansion cards and a circuit board to which the expansion cards are mounted. For example, body 206 includes printed circuit board 208 coupled to mounting structure 202, expansion card connectors 210 and expansion cards 212 mounted in expansion card connectors 210. In some embodiments, a body of an expansion card mounting assembly may also include a moveable plate, such as moveable plate 214 coupled to a mounting structure, such as mounting structure 202. In some embodiments, legs of a mounting structure, such as legs 204, may include mounting holes, such as mounting holes 216. In addition, in some embodiments, a circuit board, such as printed circuit board 208, may include cable connectors, such as cable connectors 218 configured to couple with cable plugs and communicatively couple expansion cards mounted in the expansion card mounting assembly, such as expansion cards 212, with an external system, such as a computer system. In some embodiments, communications are performed in accordance with one or more standards, such as the peripheral component interconnect express (PCIe) standard. In some embodiments, each expansion cards may be coupled to an external system via a separate cable connector, and in some embodiments, multiple expansion cards may be coupled to an external system (e.g. motherboard or controller) via a common cable connector. In some embodiments, cable connectors, such as cable connectors, 218 may be mini SAS HD connectors, or other suitable connectors.

In some embodiments, an expansion card mounting assembly includes an open space, such as opening 220 between a first end, such as end 222 and a second end such as end 224, of a mounting structure, such as mounting structure 202. The opening may allow air to flow over expansion cards mounted in the expansion card mounting assembly in multiple directions, such as an x-direction, a y-direction, a z-direction, or any combination of these directions. For example, FIG. 2A illustrates airflow 226 flowing along a length of expansion cards 212 and also flowing upward across expansion cards 212. Permitting air to flow in multiple directions may improve heat transfer from expansion cards by increasing convection between air flowing across the expansion cards and the expansion cards. Also, unlike other designs, air flow is not obstructed in the x-direction, y-direction, or z-direction by a mother board or other obstruction.

In some embodiments, expansion cards mounted on a first level of an expansion card mounting assembly may be off-set from expansion cards mounted on another level of an expansion card mounting assembly, such as a lower level. For example, expansion cards 212 mounted below printed circuit board 208 may be offset from expansion cards 212 mounted above printed circuit board 208. Off-set expansion cards may be arranged so that a width of an expansion card on a lower level is not aligned with a width of an expansion card on an upper level, but instead the widths of the upper level expansion card(s) and lower level expansion card(s) are off-set relative to each other. In this way, an expansion card on a lower level may not block vertical air flow across an expansion card at an upper level. For example, air may flow between expansion cards on a lower level and then flow over an expansion card at an upper level.

Figure 2B:
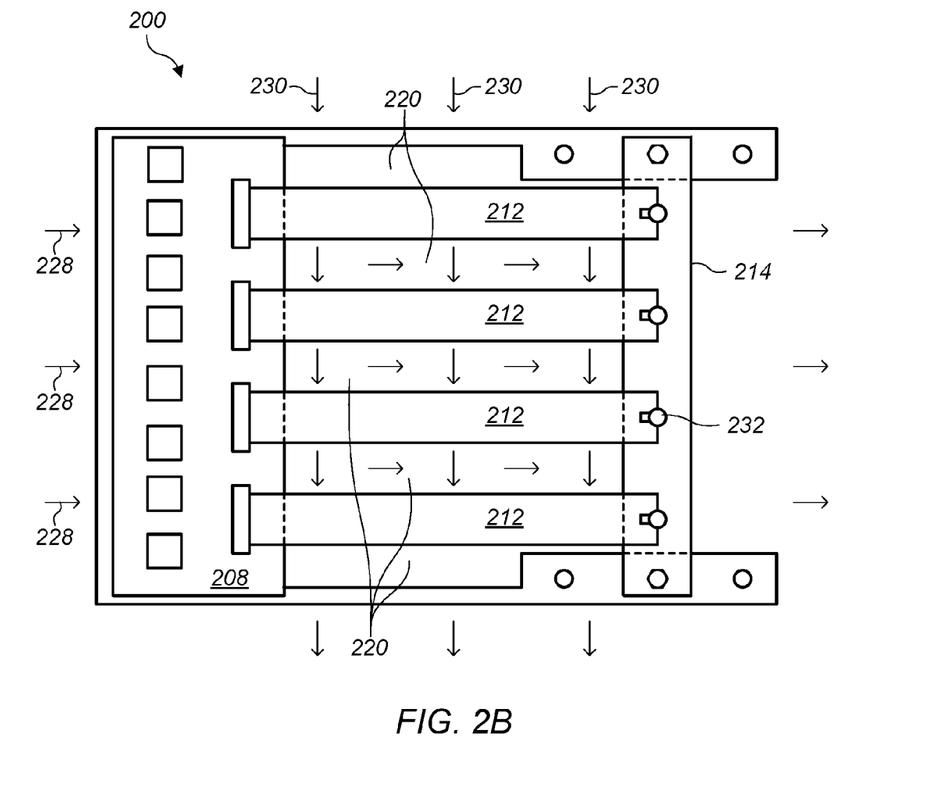
FIG. 2B illustrates a top view of an expansion card mounting assembly, according to some embodiments.

FIG. 2B illustrates a top view of an expansion card mounting assembly, according to some embodiments. Expansion card mounting assembly 200 illustrated in FIG. 2B may be the same expansion card mounting assembly 200 illustrated in FIG. 2A. As can be seen in FIG. 2B, air is permitted to flow across expansion cards 212 in x-direction 228 and in y-direction 230 via opening 220.

FIGS. 2A and 2B also illustrate retaining mechanisms 232 that are included in moveable plate 214 and that secure ends of expansion cards 212. In some embodiments, retaining mechanisms, such as retaining mechanisms 232, may be a plastic stand-off that has a female threaded interior configured to accept a threaded fastener that secures expansion cards to a moveable plate. In some embodiments, retaining mechanisms, such as retaining mechanisms 232, may include a spring and an overhanging edge that is configured to couple into a screw hole of an expansion card. In some embodiments, other suitable retaining mechanisms may be used to secure an expansion card to a moveable plate.

Figure 3:
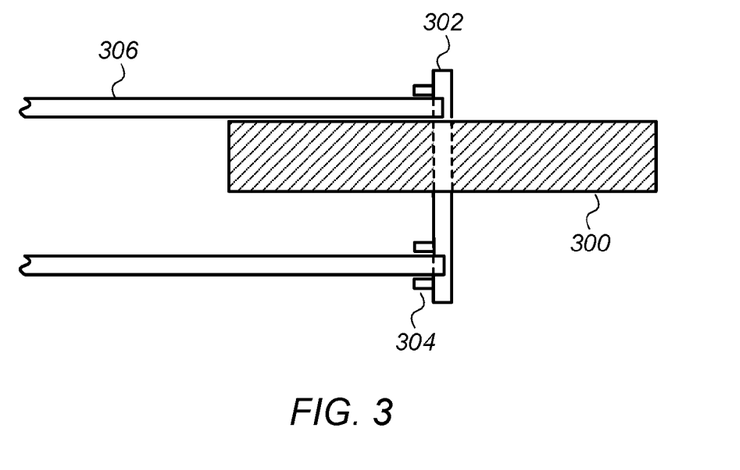
FIG. 3 illustrates a cutaway view of a moveable plate that includes retaining mechanisms, according to some embodiments.

FIG. 3 illustrates a cutaway view of a moveable plate that includes retaining mechanisms, according to some embodiments. Moveable plate 300 illustrated in FIG. 3 may be the same as moveable plate 214 illustrated in FIGS. 2A and 2B. Moveable plate 300 includes retaining mechanism 302 that secures ends of expansion cards 306. In some embodiments, a retaining mechanism, such as retaining mechanism 302 includes ledges 304 in which an expansion card, such as expansion card 306 slide into. In some embodiments, a retaining mechanism, such as retaining mechanism 302 may be made out of a flexible material, such as a flexible plastic or may include a spring that allows the retaining mechanism to bend to allow an expansion card to be inserted into the retaining mechanism and subsequently hold the expansion card in place. In some embodiments, a retaining mechanism may be a stand-off with a threaded hole that accepts a threaded fastener, such as a screw, wherein the screw is placed through a screw-hole of an expansion card to secure the expansion card to a moveable plate, such as moveable plate 300. In some embodiments, other suitable retaining mechanisms may be included in a moveable plate of an expansion card mounting assembly to secure expansion cards to a moveable plate.

In some embodiments, expansion card connectors mounted on a circuit board may be mounted in a staggered arrangement. Staggering expansion card connectors may reduce resistance to airflow across an expansion card mounting assembly and increase heat transfer. Also, in some embodiments, staggering expansion card connectors may provide additional space on a circuit board to allow cable connectors mounted on the same circuit board as the expansion card connectors to be staggered. In some embodiments, staggering cable connectors, may improve access to the cable connectors or may provide additional space for larger cables to be coupled to the cable connectors than is allowed for cables when the cable connectors are not staggered.

Figure 4:
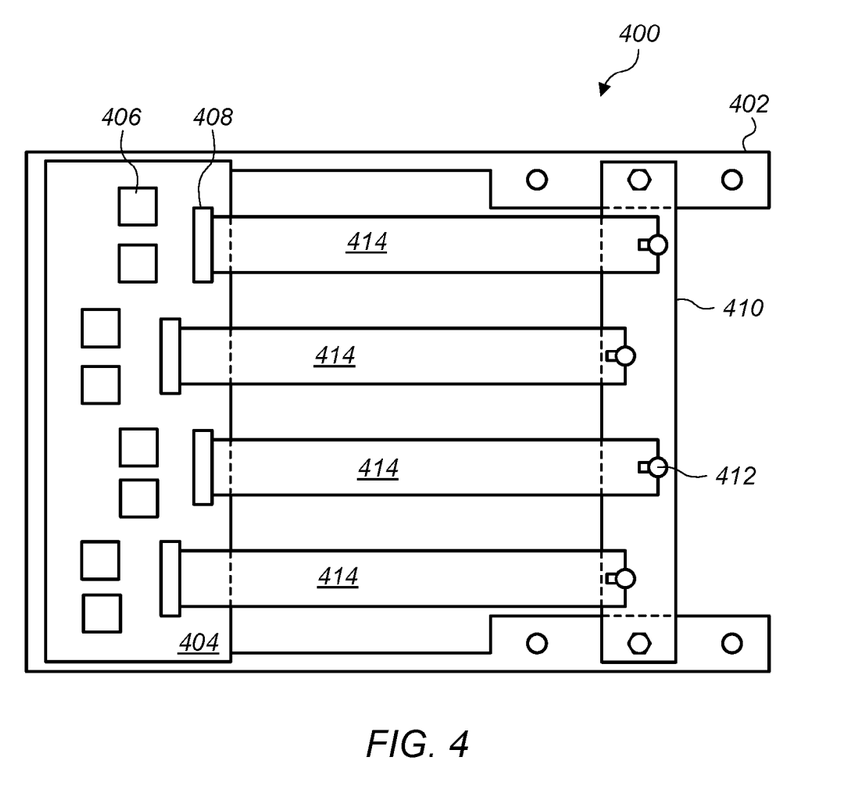
FIG. 4 illustrates a top view of an expansion card mounting assembly with staggered expansion cards, according to some embodiments.

FIG. 4 illustrates a top view of an expansion card mounting assembly with staggered expansion cards, according to some embodiments. Expansion card mounting assembly 400 includes mounting structure 402, printed circuit board 404 coupled to mounting structure 402, and moveable plate 410 coupled to mounting structure 402. Printed circuit board 404 includes cable connectors 406 mounted to printed circuit board 404 in a staggered arrangement. Printed circuit board 404 also includes expansion card connectors 408 mounted on printed circuit board 404 in a staggered arrangement. In some embodiments, cable connectors may be mounted on a printed circuit board in non-staggered arrangement while expansion card connectors are mounted on the printed circuit board in a staggered arrangement. Also, in some embodiments, cable connectors mounted on a printed circuit board may be arranged in a staggered arrangement while, expansion card connectors mounted on the printed circuit board are arranged in a non-staggered arrangement. In embodiments of an expansion card mounting assembly that include expansion card connectors mounted on a printed circuit board in a staggered arrangement, a moveable plate of the expansion card mounting assembly may have a sufficient width to secure opposite ends of the staggered expansion cards that end at different positions along the mounting structure. For example, moveable plate 410 has a sufficient width such that expansion cards 414 that end at different positions along mounting structure 402 may be secured to moveable plate 410 via retaining mechanisms 412 that are arranged on moveable plate 410 in a staggered arrangement. Any of the expansion card mounting assemblies described in FIGS. 1-3 and 5-8 may have staggered expansion cards as described in FIG. 4.

In addition to being able to secure expansion cards having different lengths at different times, in some embodiments, an expansion card mounting assembly may be configured to secure expansion cards having different lengths at the same time.

Figure 5:
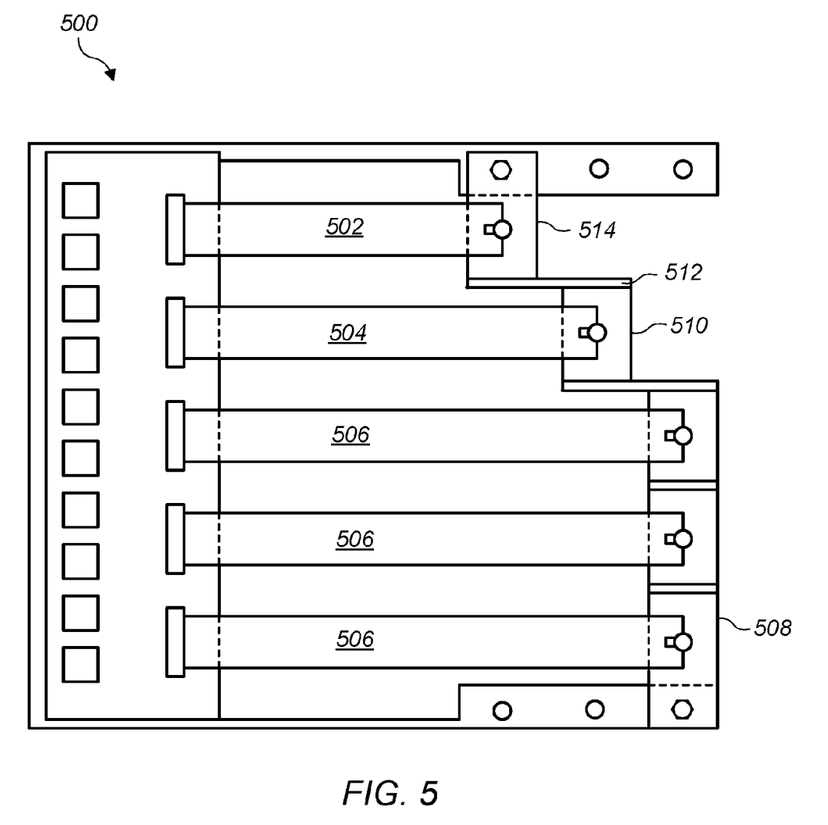
FIG. 5 illustrates a top view of an expansion card mounting assembly with different length expansion cards, according to some embodiments.

FIG. 5 illustrates a top view of an expansion card mounting assembly with different length expansion cards, according to some embodiments. In some embodiments, an expansion card mounting assembly may accept expansion cards such as expansion cards conforming to peripheral component interconnect standard M.2. M.2 cards may come in various lengths, such as a small length, medium length, and a large length. In some embodiments, an expansion card mounting assembly may be configured to mount a small length expansion card in a first position and at the same time mount a long or medium length expansion card in a second position. In some embodiments, different combinations of expansion cards with different lengths may be mounted in an expansion card mounting assembly at the same time. For example, expansion card mounting assembly 500 includes small length expansion card 502 mounted in a first position, medium length expansion card 504 mounted in a second position, and long length expansion cards 506 mounted in additional positions. In some embodiments, a moveable plate, such as moveable plate 508 may include segments, such as segment 510, and guides, such as guide 512. Each segment may be configured to slide on one or more guides that correspond with the segment to adjust a position of that segment of the moveable plate. For example, segment 514 is adjusted to accommodate small length expansion card 502, whereas segment 510 is adjusted to accommodate medium length expansion card 504. In some embodiments, a moveable plate configured to mount expansion cards having different lengths at the same time may have fixed segments and may not include guides. In some embodiments, guides, such as guide 512 may extend a length of the mounting structure and segments, such as segment 510 may be positioned along the guide.

In some embodiments, a moveable plate may be configured in other ways to secure expansion cards having different lengths at the same time.

Figure 6A:
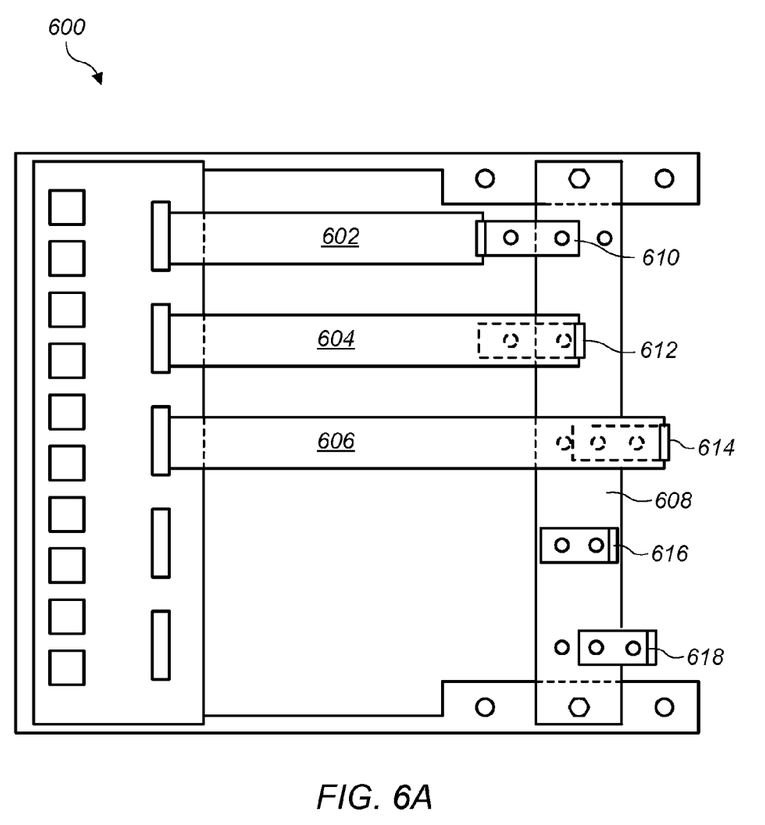
FIG. 6A illustrates a top view of an expansion card mounting assembly with different length expansion cards, according to some embodiments.

FIG. 6A illustrates a top view of an expansion card mounting assembly with different length expansion cards, according to some embodiments. Expansion card mounting assembly 600 includes small length expansion card 602, medium length expansion card 604, and long length expansion card 606. Expansion card mounting assembly 600 also includes moveable plate 608 and retaining mechanisms 610, 612, 614, 616, and 618 coupled to moveable plate 608. Retaining mechanisms 610, 612, 614, 616, and 618 include multiple holes that can be aligned with one or more holes of a set of holes in moveable plate 608 to adjust a position of one of the retaining mechanisms. For example, a right most hole of retaining mechanism 610 is aligned with a left most hole of moveable plate 608 to cause retaining mechanism 610 to be positioned to secure shorter length expansion card 602. As another example, a right most hole of retaining mechanism 612 is aligned with a left most hole of moveable plate 608 to cause retaining mechanism 612 to secure medium length expansion card 604. As a further example, a left most hole of retaining mechanism 614 is aligned with a right most hole of moveable plate 608 to cause retaining mechanism 614 to secure longer length expansion card 606. In some embodiments, a screw, rivet, pin or other suitable fastener may be used to couple a retaining mechanism to a moveable plate via aligned holes. In some embodiments, other suitable retaining mechanisms may be used.

Figure 6B:
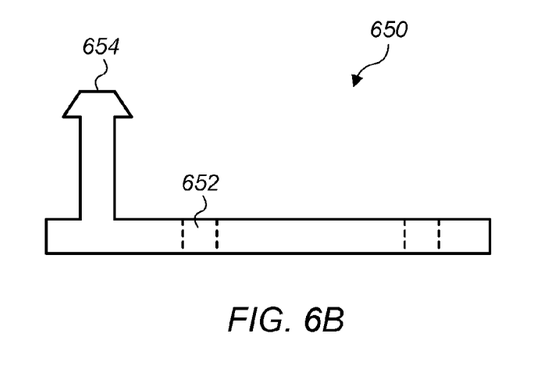
FIG. 6B illustrates a retaining mechanism, according to some embodiments.

FIG. 6B illustrates a retaining mechanism, according to some embodiments. Retaining mechanism 650 may be any of the retaining mechanisms described in FIG. 6A or in FIGS. 1-5 and 7-8. Retaining mechanism 650 includes holes 652 and a retaining bracket 654 that is at a height corresponding to a thickness of expansion cards to be secured by retaining mechanism 650.

In some embodiments, an expansion card mounting assembly may be mounted in a chassis with a motherboard in a position in the chassis downstream of the motherboard. For example air may flow through the chassis from a front side to a back side, and an expansion card mounting assembly may be located in the chassis closer to the back side of the chassis than an upstream motherboard assembly. In some embodiments, multiple expansion card mounting assemblies may be stacked on top of one another in a common chassis.

Figure 7:
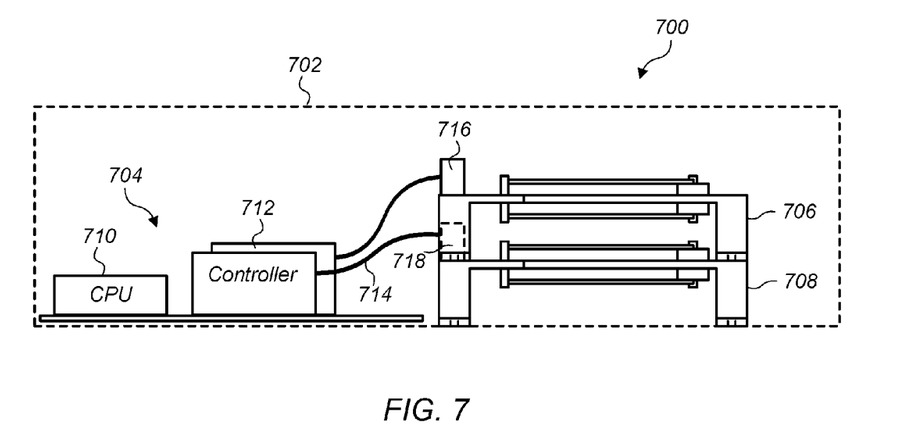
FIG. 7 illustrates stacked expansion card mounting assemblies in a common chassis, according to some embodiments.

FIG. 7 illustrates stacked expansion card mounting assemblies in a common chassis, according to some embodiments. Computer system 700 includes chassis 702, motherboard assembly 704, and expansion card mounting assembly 706 stacked above expansion card mounting assembly 708. Motherboard assembly 704 includes central processing unit 710, controllers 712, and circuit board 716.

Motherboard assembly 704 may also include various other electrical components, such as semiconductor devices, memory modules (such as DIMMs), or fans, to perform various functions in computer system 700. Circuit board 716 of motherboard assembly 704 is coupled to, and supported by, chassis 702. Expansion card mounting assembly 708 is also coupled to chassis 702 and expansion card mounting assembly 706 is coupled to expansion card mounting assembly 708. Both expansion card mounting assemblies 706 and 708 are supported by chassis 702. Cables 714 couple controllers 712 of motherboard assembly 704 to expansion card mounting assemblies 706 and 708 via cable connectors 716 and 718. In some embodiments, cables 714 may be various types of cables, such as fiber optic cables, copper cables, etc. In some embodiments multiple controllers, such as controllers 712 may be coupled to multiple expansion cards in one of expansion card mounting assemblies 706 or 708 via a common cable connector, such as a common mini SAS HD connector. In some embodiments, controllers may be coupled to expansion cards via separate cable connectors. In some embodiments, a cable connector, a corresponding expansion card connector, and an expansion card mounted in the expansion card connector may operate independently from other expansion cards, expansion card connectors, and cable connectors mounted in an expansion card mounting assembly. In some embodiments, expansion cards mounted in an expansion card mounting assembly may share power from a common power supply of the expansion card mounting assembly but may otherwise operate independently of one another.

In some embodiments, an expansion card mounting assembly, such as expansion card mounting assembly 706 or 708, may be configured to independently mount in a computer system chassis. For example, chassis 702 may include rails and expansion card mounting structures 706 and 708 may be configured to independently mount in chassis 702 via rails included in chassis 702. In some embodiments, motherboard assembly 704 may include blind mate connectors that are configured to couple with cable connectors 716 and 718 of expansion card mounting assemblies 706 and 708. In some embodiments, cables 714 may be omitted and cable connectors 716 and 718 may directly couple with blind mate connectors included in circuit board assembly 704. In some embodiments, expansion card mounting assemblies, such as expansion card mounting assemblies 706 and 708, may each be configured to independently be inserted into and removed from a computer system chassis, such as chassis 702.

In some embodiments, an expansion card mounting assembly may be mounted directly on a motherboard.

Figure 8:
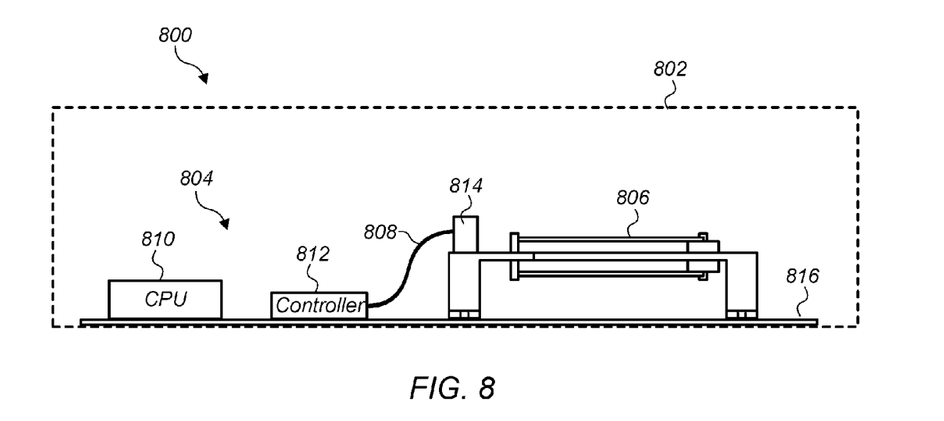
FIG. 8 illustrates an expansion card mounting assembly mounted on a motherboard, according to some embodiments.

FIG. 8 illustrates an expansion card mounting assembly mounted on a motherboard, according to some embodiments. Computer system 800 includes chassis 802, motherboard assembly 804, and expansion card mounting assembly 806. Motherboard assembly 804 includes central processing unit 810, controllers 812, and circuit board 816. Cables 808 couple controller 812 to cable connectors 814 of expansion card mounting assembly 806. In some embodiments, a motherboard assembly may include various numbers of controllers and a computer system may include various numbers of cables that couple controllers with cable connectors of an expansion card mounting assembly. In some embodiments, an expansion card mounting assembly, such as expansion card mounting assembly 806 may mount on a circuit board, such as circuit board 816, above components mounted on the circuit board. For example, an expansion card mounting assembly may span a portion of a motherboard assembly and mother board assembly components such as memory modules, processors, or other motherboard assembly components may be mounted on the motherboard in a space below the expansion card mounting assembly.

In some embodiments, expansion cards of an expansion card mounting assembly may be solid state devices that provide additional storage capabilities to a computer system, such as computer system 700 or computer system 800. In some embodiments, expansion cards may include processing capabilities such as systems on a chip (SoCs), graphic cards, programmable gate arrays, or other types of cards that augment capabilities of a computer system, such as computer system 700 or computer system 800.

In some embodiments, controllers, such as controllers 712 and 812, may control storage operations performed on expansion cards that are solid state storage devices.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An expansion card mounting assembly comprising:
   a mounting structure;
   a printed circuit board (PCB) coupled to the mounting structure, wherein the PCB comprises multiple expansion card connectors on a first side of the PCB and multiple expansion card connectors on a second side of the PCB;
   expansion cards mounted in the expansion card connectors on the first side of the PCB and expansion cards mounted in the expansion card connectors on the second side of the PCB; and
   a moveable plate coupled to the mounting structure at an end of the mounting structure opposite of an end of the mounting structure configured to couple with the PCB, wherein the moveable plate is configured to secure opposite ends of the expansion cards that are opposite from ends of the expansion cards coupled with the expansion card connectors of the PCB,
   wherein the expansion card mounting assembly comprises multiple levels including the expansion cards mounted on the first side of the PCB at a first level of the expansion card mounting assembly, and including the expansion cards mounted on the second side of the PCB at a second level of the expansion card mounting assembly,
   wherein the mounting structure is configured to support the PCB and support the expansion cards at the first level of the expansion card mounting assembly and support the expansion cards at the second level of the expansion card mounting assembly, and
   wherein the mounting structure comprises an opening between the first level and the second level of the expansion card mounting assembly along a length of the expansion cards, wherein the opening is configured to permit airflow between the expansion cards mounted on the first side of the PCB and the expansion cards mounted on the second side of the PCB.

2. The expansion card mounting assembly of claim 1, wherein the expansion cards have a form factor that is in accordance with a peripheral component interconnect (PCI) M.2 standard.

3. The expansion card mounting assembly of claim 2, wherein
   the mounting structure and the moveable plate are configured to adjust a position of the moveable plate on the mounting structure to secure expansion cards having different lengths.

4. The expansion card mounting assembly of claim 3, wherein respective lengths of the expansion cards mounted in the expansion card mounting assembly at a given time are a same length.

5. A device comprising: a mounting structure configured to: couple with a circuit board at a first end of the mounting structure, and support the circuit board, an expansion card mounted on a first side of the circuit board, an expansion card mounted on a second side of the circuit board, wherein each of the expansion card mounted on the first side and the expansion card mounted on the second side extends, parallel to the circuit board, between the circuit board and a second end of the mounting structure that is opposite the first end of the mounting structure, and wherein the mounting structure comprises an opening configured to permit airflow between the expansion card mounted on the first side of the circuit board coupled to the mounting structure and the expansion card mounted on the second side of the circuit board coupled to the mounting structure.

6. The device of claim 5 further comprising: a moveable plate coupled to the mounting structure at the second end of the mounting structure, wherein the moveable plate is configured to secure ends of expansion cards opposite to ends of the expansion cards that are coupled with the circuit board.

7. The device of claim 6, wherein the mounting structure and the moveable plate are configured to secure expansion cards of a same length at a given time.

8. The device of claim 6, wherein the mounting structure and the moveable plate are configured to secure a first expansion card having a longer length and, at the same time, secure a second expansion card having a shorter length.

9. The device of claim 6, further comprising:
the circuit board, wherein the circuit board is coupled to the mounting structure; and
the expansion cards, wherein the expansion cards are mounted in expansion card connectors of the circuit board.

10. The device of claim 5, wherein the mounting structure is configured to support expansion cards with a form factor that meets a peripheral component interconnect (PCI) M.2 standard.

11. The device of claim 5, wherein the mounting structure further comprises legs or rails configured to elevate a body of the mounting structure above a motherboard or chassis.

12. The device of claim 5, wherein the mounting structure is configured to stack above or below another expansion card mounting structure in a common chassis.

13. The device of claim 5, wherein the mounting structure is configured to be independently inserted into or removed from a computer system chassis, independent of other devices mounted in the computer system chassis.

14. A device comprising:
a mounting structure, wherein the mounting structure is configured to couple with a circuit board and configured to support the circuit board and an expansion card coupled to the circuit board at an end of the expansion card; and
a moveable plate coupled to the mounting structure,
wherein the moveable plate and the mounting structure are configured to adjust a location of the moveable plate on the mounting structure to secure an other end of the expansion card, and
wherein the circuit board has multiple expansion cards coupled at first ends to the circuit board on a first side of the circuit board and multiple expansion cards coupled at first ends to the circuit board on a second side of the circuit board that is opposite the first side with respect to a plane defined by the circuit board.

15. The device of claim 14, wherein:
the first side of the circuit board is a top side of the circuit board,
the second side of the circuit board is a bottom side of the circuit board,
the moveable plate comprises retaining mechanisms on a top side of the moveable plate and retaining mechanisms on a bottom side of the moveable plate, and
the retaining mechanisms are configured to secure other ends of multiple expansion cards on a top side of the moveable plate and to secure other ends of multiple expansion cards on a bottom side of the moveable plate.

16. The device of claim 15, further comprising an opening in the mounting structure between a portion of the mounting structure configured to couple with the circuit board and the moveable plate, wherein the opening is configured to permit airflow between expansion cards on a top side of a circuit board coupled to the mounting structure and expansion cards on a bottom side of a circuit board coupled to the mounting structure.

17. The device of claim 14, wherein the moveable plate and the mounting structure are configured to secure a first expansion card having a first length mounted in a first position and, at the same time, secure a second expansion card having a second length in a second position, wherein the first length and the second length are different lengths.

18. The device of claim 14, wherein the moveable plate is further configured to secure expansion cards that are coupled to the circuit board at ends of the expansion cards via expansion card connectors arranged on the circuit board in a staggered arrangement or that are arranged in an off-set arrangement, wherein in the off-set arrangement expansion cards at a first level of the expansion card mounting assembly are off-set from expansion cards at another level of the expansion card mounting assembly.

19. The device of claim 14, wherein the mounting structure is configured to support expansion cards with a form factor that is in accordance with a peripheral component interconnect (PCI) M.2 standard.

20. The device of claim 14, wherein the mounting structure further comprises legs or rails configured to elevate a body of the mounting structure above a motherboard or chassis.

21. The device of claim 14, wherein the mounting structure is constructed from sheet metal or plastic.

* * * * *

UNITED STATES PATENT AND TRADEMARK OFFICE
CERTIFICATE OF CORRECTION

PATENT NO.        : 9,791,900 B1
APPLICATION NO.   : 15/083197
DATED             : October 17, 2017
INVENTOR(S)       : Christopher Strickland Beall et al.

It is certified that error appears in the above-identified patent and that said Letters Patent is hereby corrected as shown below:

Item (72) Inventor List:
Please remove inventor "Yangtzu Lee Andrew Lee" and insert --Yangtzu Andrew Lee-- in place thereof.

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*